United States Patent [19]

Arendt et al.

[11] Patent Number: 5,204,316

[45] Date of Patent: * Apr. 20, 1993

[54] PREPARATION OF TAPE OF SILVER COVERED BI-PB-CA;SR-CU-O ORIENTED POLYCRYSTAL SUPERCONDUCTOR

[75] Inventors: Ronald H. Arendt, Schenectady; Mary F. Garbauskas, Clifton Park, both of N.Y.

[73] Assignee: General Electric Company, Schenectady, N.Y.

[*] Notice: The portion of the term of this patent subsequent to Oct. 15, 2008 has been disclaimed.

[21] Appl. No.: 502,712

[22] Filed: Apr. 2, 1990

[51] Int. Cl.$^5$ ............................................. H01L 39/24
[52] U.S. Cl. ............................................. 505/1; 29/599; 505/928; 505/930
[58] Field of Search ................... 29/599; 505/1, 705, 505/928, 930

[56] References Cited

U.S. PATENT DOCUMENTS

| | | | |
|---|---|---|---|
| 4,885,273 | 12/1989 | Sugimoto et al. | 505/1 |
| 5,057,486 | 10/1991 | Arendt et al. | 505/1 |
| 5,057,488 | 10/1991 | Arendt et al. | 505/1 |

OTHER PUBLICATIONS

Dou, S. X., Liu, H. K., Apperley, M. H., Song, K. H., & Sorrell, C. C., "Critical Current Density In Superconducting Bi-Pb-Sr-Ca-Cu-O Wires and Coils", Supercon. Sci. Technol. 3 (1990) pp. 138-142.

*Primary Examiner*—Joseph M. Gorski
*Attorney, Agent, or Firm*—James Magee, Jr.

[57] ABSTRACT

A silver tube with one open end is packed with a particulate mixture of reactants comprised of $Bi_2CaSr_2Cu_2O_{8\pm x}$, $Ca_2CuO_3$, cupric oxide and lead oxide, the open end of the packed tube is plugged with silver, the resulting closed tube is swaged to increase the density of the packed mixture, the swaged tube is wire-drawn, uniaxial pressure is applied to the wire orienting the $Bi_2CaSr_2Cu_2O_{8\pm x}$ crystals with their c-axis parallel to each other forming an initial tape, the initial tape is fired to convert part of the $Bi_2CaSr_2Cu_2O_{8\pm x}$ crystals to $Bi_{2-y}Pb_yCa_2Sr_2Cu_3O_{10\pm z}$ crystals producing an intermediate tape containing dilated product, uniaxial pressure is applied to the resulting intermediate tape to remove the dilation in the product, and the pressed intermediate tape is fired to produce a tape comprised of silver enveloping a sintered body of $Bi_{2-y}Pb_yCa_2Sr_2Cu_3O_{10\pm z}$.

6 Claims, No Drawings

PREPARATION OF TAPE OF SILVER COVERED BI-PB-CA;SR-CU-O ORIENTED POLYCRYSTAL SUPERCONDUCTOR

This is related to the following copending applications which are assigned to the assignee hereof and incorporated herein by reference.

U.S. Ser. No. 07/489,309, filed about Mar. 2, 1990, for R. H. Arendt and M. F. Garbauskas, for "SYNTHESIS OF Bi-Pb-Ca-Sr-Cu-O ORIENTED POLYCRYSTAL SUPERCONDUCTOR";

U.S. Ser. No. 07/478,393, filed about Feb. 10, 1990, for R. H. Arendt and M. F. Garbauskas, for "SYNTHESIS OF Bi-Pb-Ca-Sr-Cu-O SUPERCONDUCTIVE MATERIAL"; and U.S. Ser. No. 07/399,197, filed Aug. 28, 1989, for R. H. Arendt, for "SYNTHESIS OF Bi-Ca-Sr-Cu-O SUPERCONDUCTIVE MATERIAL".

The present invention relates to the preparation of tape comprised of elemental silver covering a superconductive sintered oxide body in the system bismuth-lead-calcium-strontium-copper-oxygen. The silver covering leaves none, or no significant portion of, the longitudinal surface of the sintered body exposed. Specifically, the present invention is directed to a process for producing tape composed of elemental silver covering a superconductive polycrystalline sintered body containing the superconductive phase $Bi_{2-y}Pb_yCa_2Sr_2Cu_3O_{10\pm z}$ where y ranges from 0.1 to 0.5, preferably from 0.25 to 0.35, and most preferably it is 0.3, and z ranges from zero to less than 1. This phase or composition also is referred to herein as (2223). In the present sintered body, the c-axis of the $Bi_{2-y}Pb_yCa_2Sr_2Cu_3O_{10\pm z}$ phase are oriented at least sufficiently parallel to each other so as not to differ significantly from a common direction, i.e. the c-axis of the (2223) phase are substantially parallel to each other. The fraction of the (2223) grains or crystals which are randomly oriented, i.e. those with their c-axis differing significantly from a common direction, generally is small and not significant.

The present invention utilizes as a reactant, superconductive $Bi_2CaSr_2Cu_2O_{8\pm x}$ where x ranges from 0 to 0.5. This superconductive reactant also is referred to herein as (2122).

Briefly stated, in one embodiment, the present process for producing a final tape comprised of a continuous elongated solid sintered body with its longitudinal surface enveloped with elemental silver leaving no significant portion of said longitudinal surface exposed, said sintered body containing oriented superconductive crystalline $Bi_{2-y}Pb_yCa_2Sr_2Cu_3O_{10\pm z}$ phase where y ranges from 0.1 to .05 and z ranges from zero to less than 1 in an amount of at least 90% by weight of said body, comprises the following steps:

(a) forming a particulate mixture of reactants comprised of $Bi_2CaSr_2Cu_2O_{8\pm x}$ where x ranges from 0 to 0.5, $Ca_2CuO_3$, cupric oxide, and lead oxide, said mixture of reactants being formulated to produce said superconductive phase and to provide an excess amount of said $Ca_2CuO_3$ and cupric oxide sufficient to drive the reaction to produce said superconductive phase in said sintered body, said $Ca_2CuO_3$ and cupric oxide in said mixture being present in substantially mole equivalents to each other, said $Bi_2CaSr_2Cu_2O_{8\pm x}$ being comprised of substantially monodispersed crystals, said particulate mixture being a sinterable mixture;

(b) providing a hollow tube open at one end comprised of elemental silver, said tube having dimensions sufficient to produce said tape;

(c) packing said particulate mixture into said silver tube to produce a packed particulate mixture therein having a density ranging from 40% to 60% of its theoretical density;

(d) closing the open end of the resulting packed tube with elemental silver producing a closed tube comprised of said packed mixture and silver;

(e) applying physical force to the resulting packed tube in the radial direction to increase the density of said packed mixture to at least 65% of its theoretical density producing a deformed tube, (f) drawing said deformed tube to produce a wire, said wire having dimensions sufficient to produce said tape;

(g) applying uniaxial pressure to said wire in the radial direction to orient said $Bi_2CaSr_2Cu_2O_{8\pm x}$ crystals with their c-axis substantially parallel to each other producing an initial tape with two major opposed surfaces to which said c-axis of said $Bi_2CaSr_2Cu_2O_{8\pm x}$ crystals are substantially perpendicular;

(h) firing said initial tape in an oxidizing atmosphere at a reaction temperature ranging from 820° C. to 860° C. converting a sufficient amount of said $Bi_2CaSr_2Cu_2O_{8\pm x}$ crystals to said superconductive crystalline $Bi_{2-y}Pb_yCa_2Sr_2Cu_3O_{10\pm z}$ phase to produce an intermediate tape containing a significantly dilated intermediate partly reacted sintered product wherein said $Bi_{2-y}Pb_yCa_2Sr_2Cu_3O_{10\pm z}$ phase ranges from 50% to less than 70% by weight of said intermediate product;

(i) cooling the intermediate tape in an oxidizing atmosphere producing an intermediate tape containing intermediate solid sintered product;

(j) applying uniaxial pressure to a major surface of the resulting intermediate tape to at least remove the dilation produced in step (h);

(k) firing the resulting pressed intermediate tape containing pressed intermediate product in an oxidizing atmosphere at a reaction temperature ranging from 820° C. to 860° C. to produce a tape containing finally sintered reaction product wherein said superconductive phase comprises at least 90% by weight of said reaction product, said reaction temperature being below the temperature at which sufficient liquid forms to prevent production of said sintered products, said pressed intermediate product undergoing no significant dilation in said final firing; and (l) cooling the resulting tape in an oxidizing atmosphere producing said final tape wherein said solid sintered body has an open porosity ranging from 5% to 20% by volume of the body, said steps (h), (i), and (j) being carried out sufficiently to produce said tape containing said finally sintered reaction product in step (k).

In carrying out the present process, a superconductive powder comprised of the reactant $Bi_2CaSr_2Cu_2O_{8\pm x}$ where x ranges from 0 to 0.5, i.e. (2122), is used. Preferably, x has a value of 0. The (2122) powder should contain (2122) in an amount of at least 90% by weight of the powder and all other components which may be present in the (2122) powder should have no significant deleterious effect on the present process. Preferably, the (2122) powder contains (2122) in an amount greater than 95%, or greater than 98%, by weight of the powder. More preferably, the (2122) powder is phase pure (2122) according to X-ray diffraction analysis.

Preferably, the (2122) powder has a zero resistance transition temperature, i.e. a temperature at which there is no electrical resistance, greater than about 70K, and preferably it is about 80K.

(2122) material can be produced in a known manner by solid state reaction, i.e. firing an intimate mixture of the constituent oxides in an oxidizing atmosphere, for example, air, and cooling the reaction product in an oxidizing atmosphere. However, it is difficult to produce a powder containing (2122) in an amount greater than 90% to 95% by weight of the powder by solid state reaction.

Preferably, the (2122) material is produced according to U.S. Ser. No. 07/399,197 which discloses a process for producing a sinterable superconductive powder comprised of a composition represented by the formula $Bi_2CaSr_2Cu_2O_x$ where x ranges from about 7.5 to about 8.5, which comprises providing a first mixture of calcium carbonate, strontium carbonate and copper oxide, firing said first mixture in air at a temperature at which no liquid forms until said carbonates decompose leaving no significant amount thereof resulting in a substantially combined Ca—Sr—Cu-oxide product, forming a second mixture comprised of said oxide product, bismuth sesquioxide and an alkali chloride solvent, said Ca—Sr—Cu-oxide product and bismuth sesquioxide being formulated to produce said superconductive composition, said alkali chloride solvent being selected from the group consisting of sodium chloride, potassium chloride and combinations thereof, heating said second mixture to a reaction temperature at least sufficient to melt said chloride solvent, maintaining said reaction temperature continuously dissolving said oxide product and bismuth sesquioxide in the resulting molten chloride solvent and continuously reacting the oxides dissolved in said molten chloride solvent thereby precipitating a material of said superconductive composition, said alkali chloride solvent being present in an amount at least sufficient to carry out the production of said superconductive material, cooling the resulting reacted mass to solidify the molten chloride, adding water to the resulting solidified mass dissolving the alkali chloride, recovering said precipitated superconductive material, and comminuting said superconductive material to produce a powder.

The (2122) material produced according to U.S. Ser. No. 07/399,197 generally contains (2122) in an amount greater than 98% by weight of the material, and usually, it is phase pure (2122) according to X-ray diffraction analysis.

(2223) material cannot be produced according to the process disclosed in U.S. Ser. No. 07/399,197.

Preferably, before it is admixed with the other reactants, the (2122) material is comminuted to produce a powder substantially comprised of monodispersed crystals of desired size, determined empirically, which enables the present reaction to be carried out. Preferably, the (2122) powder has an average particle size ranging in its longest dimension up to 10 microns, and more preferably it is less than 2 microns. Conventional comminuting techniques can be used which have no significant deleterious effect on the resulting powder.

In the present process, an oxide product comprised of a mixture of $Ca_2CuO_3$ and CuO is used to form the mixture of reactants. Generally, this oxide product is comprised of a substantially uniform, or uniform, i.e. intimate, mixture of $Ca_2CuO_3$ and CuO.

Generally, to produce the oxide product, a particulate mixture of calcium carbonate and copper oxide initially is formed which preferably is uniform or substantially uniform. The mixture is of a size, determined empirically, which enables production of the oxide product, and frequently ranges in size from submicron to 20 microns, preferably having an average particle size which is submicron. The mixture can be produced by conventional techniques which have no significant deleterious effect on the components. Preferably, the components are wet milled at room temperature in distilled water, preferably with zirconia milling media, and then dried in air. Generally, the mixture is formulated to produce mole equivalents, or substantially mole equivalents, of calcium oxide and cupric oxide. The resulting mixture is fired in air at about atmospheric pressure at a temperature at least sufficient to decompose the carbonate but not so high as to form a significant amount of liquid. A significant amount of liquid would separate the components in areas of the mixture resulting in a significantly non-uniform product. Generally, firing temperature ranges from greater than about 850° C. to less than about 950°C, and preferably it is about 925° C. Firing is carried out at least until no significant amount of the carbonate remains. In this firing, any cuprous oxide forms cupric oxide and the carbonate decomposes to calcium oxide and reacts with cupric oxide to form the oxide product comprised of a mixture of $Ca_2CuO_3$ and CuO. The oxide product is cooled in air at about atmospheric pressure, and preferably, it is furnace cooled to room temperature. In the oxide product, $Ca_2CuO_3$ and CuO are present in mole equivalents, or substantially mole equivalents, to each other. Generally, the oxide product contains no significant amount of, and preferably it is free of, calcium oxide and cuprous oxide. The reaction is as follows:

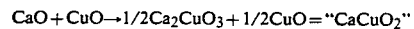

$$CaO + CuO \rightarrow 1/2 Ca_2CuO_3 + 1/2 CuO = \text{``CaCuO}_2\text{''}$$

The oxide product is friable, and preferably, before it is mixed with the other reactants, it is lightly dry ground in a conventional manner, for example, by mortar and pestle, to produce a flowable powder, generally about 40 mesh (U.S. Screen Size).

Generally, lead oxide powder is used and is satisfactory in the particle size range in which it is available commercially, which ranges in average particle size from submicron to 10 microns.

In carrying out the present process, a particulate mixture of the reactants comprised of the (2122) material, $Ca_2CuO_3$, cupric oxide and lead oxide is provided. The reactants are used in amounts which will produce the superconductive (2223) powder of desired composition in the present process and such amounts are determined empirically. Specifically, the mixture of reactants is formulated to produce (2223) and to include an excess amount of the oxide product comprised of the mixture of $Ca_2CuO_3$ and CuO, or for convenience also referred to herein as "$CaCuO_2$". The excess amount of "$CaCuO_2$" should be sufficient to convert (2122) to the required amount of (2223) in the present process. Such excess amount of the "$CaCuO_2$" is determined empirically and depends largely on the fineness of the reactants. The finer the reactants, the greater is the contact therebetween and the less is the excess amount of "$CaCuO_2$" required to drive the reaction to form (2223). The reaction is as follows:

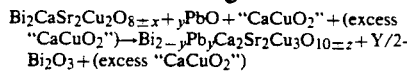

Generally, from 1.1 to 1.75 moles of total "CaCuO$_2$" is used per mole of (2122) in the mixture of reactants.

Generally, the amount of lead oxide depends largely on the particular amount of Pb desired in (2223).

The reactants are admixed to produce a particulate mixture which is sufficiently uniform and is of a sufficiently fine size to carry out the reaction and sintering to produce the present superconductive (2223) body. Preferably, the reactants are admixed to produce as intimate a mixture as possible without significant contamination to insure good contact.

Conventional mixing and comminuting techniques can be used which have no significant deleterious effect on the components and do not introduce undesirable impurities into the resulting product.

In one embodiment, the mixture of reactants is dry milled, i.e. preferably with zirconia media, in a dry atmosphere such as nitrogen.

In a preferred mixing and comminuting embodiment, the reactants are wet milled and the resulting slurry is dried in a dry gas. Preferably, the reactants are milled in an organic liquid vehicle in which they are inert or substantially inert, i.e. with which they do not react. Preferably, the organic liquid vehicle is non-aqueous or contains no significant amount of water. Generally, it is comprised of a solution of organic liquid and a few drops of dispersant. Also, preferably, the organic liquid has a boiling point of less than 100° C., and preferably it is heptane.

The dispersant is an organic material and should be soluble in the liquid milling medium chosen. It need only be used in an amount which effectively aids in dispersing the reactants and such amount is determined empirically. Generally, the dispersant is used in an amount of less than 1% by volume of the total volume of slurry. The dispersant, or liquid vehicle, should volatilize away at an elevated temperature ranging up to 820° C. Such dispersants are commercially available.

Preferably, to form the slurry, milling is carried out at about room temperature and zirconia milling media is used. The resulting mixture can be collected in a conventional manner which has no significant deleterious effect thereon. Preferably, the slurry is dried and then separated from the milling media. Preferably, the slurry is dried in a dry gas with which it does not react, or does not react to any significant extent. Conveniently, the dry gas is nitrogen, air, or mixtures thereof. By a dry gas herein, it is meant a gas containing 100 parts per million of water or less. Drying can be carried out at about atmospheric pressure or under a partial vacuum. Preferably, drying is carried out at a temperature ranging from about 50° C. to about 70° C.

Any dispersant remaining in the dried particulate mixture preferably is volatilized away by firing the mixture in the drying gas at a temperature of less than 820° C. in a container with which it does not react to any significant extent, such as alumina, leaving no amount of dispersant which would have a significantly deleterious effect on the transition temperature of the resulting sintered body. Preferably, the fired mixture is furnace-cooled in the drying gas to about room temperature. Preferably, the milling media is separated from the mixture after all drying, but before the firing has been completed.

The resulting particulate mixture of reactants is of a sinterable size determined empirically. The (2122) powder generally has an average particle size ranging in its longest dimension to less than 10 microns, and preferably it is less than 2 microns, and the remaining reactants preferably have an average particle size ranging from submicron to 2 microns. The (2122) powder is comprised, or substantially comprised, of monodispersed crystals.

In carrying out the present process, a hollow tube closed at one end and open at the opposite end and comprised of elemental silver is used. The dimensions of the tube, i.e., length, thickness, and inner diameter, should be sufficient to enable production of the final tape herein and are determined empirically. Generally, the tube can be as long as desired, and usually, it is longer than 6 inches. Generally, the tube has an inner diameter ranging from 0.25 to 0.50 inches, frequently ranging from 0.3 to 0.5 inches. Generally, the tube has a thickness ranging from 0.010 to 0.100 inches, frequently ranging from 0.020 to 0.070 inches.

Generally, a hollow tube of elemental silver open at both ends is commercially available. Such a tube can be used in the present process by initially closing one end of the tube. Such closing can be carried out in a conventional manner, such as by plugging the end with elemental silver.

The silver tube closed at one end can be packed with the present sinterable particulate mixture of reactants in a conventional manner. For example, the mixture can be tamped into the tube. Generally, packing is carried out in air at about atmospheric pressure and room temperature. Generally, the resulting packed mixture has a density ranging from 40% to 60% of its theoretical density. Such a density is determined empirically and generally it is necessary to enable production of the final tape in the present process. Preferably, the packed mixture fills or substantially fills the tube.

The open end of the resulting packed tube can be closed in a conventional manner such as by plugging it with elemental silver. Preferably, closing of the end of the packed tube produces a closed tube with no free space remaining therein which would significantly decrease the density of the packed mixture. Preferably, the closed tube maintains the density of the packed mixture of reactants.

Physical force is applied to the closed packed tube in the radial direction to increase the density of the packed mixture to at least 65%, generally ranging from 65% to 80%, of its theoretical density. Such density is determined empirically and enables production of the sintered body in the final tape. Generally, such physical force is applied in air at about atmospheric pressure. Such physical force can be applied in a conventional manner such as by swaging the tube. The physical force or swaging generally produces a significantly reduced outer diameter coupled with elongation. Generally, the physical force or swaging is applied at about room temperature, but it may be applied at an elevated temperature, determined empirically, which enables production of the final tape herein.

The resulting deformed or swaged tube can be wiredrawn in a conventional manner to produce a wire having dimensions, determined empirically, for example, outside diameter and length, sufficient to produce the final tape. Generally, the wire can be as long as desired, and usually, it is longer than 18 inches. Generally, the outside diameter of the wire ranges from 0.002 to 0.050 inches, frequently ranging from 0.010 to 0.050 inches.

The wire drawing can be carried out in a conventional manner using conventional equipment. Generally, it is carried out in air at about atmospheric pressure. Generally, it is carried out at about room temperature, but it may be carried out at an elevated temperature, determined empirically, which enables production of the final tape herein.

A uniaxial pressure is applied to the wire in its radial direction to cause the (2122) crystals to orient so that their c-axis are substantially parallel to each other. Such orientation can be determined empirically by a number of conventional techniques. Generally, the uniaxial pressure is applied to the wire in air at about room temperature but it can be applied to the wire at an elevated temperature, determined empirically, which enables production of the final tape herein.

The uniaxial pressure can be applied by conventional techniques. For example, it can be applied by means of a hydraulic press or by passing the wire through rollers. The application of the uniaxial pressure to the wire produces a tape, i.e. the initial tape, having two major opposed surfaces, i.e. faces.

In one embodiment, the packed mixture of reactants in the initial tape is totally enveloped or encapsulated with elemental silver leaving none, or no significant portion thereof, exposed. In another embodiment, the outer longitudinal surface of the packed mixture of reactants in the initial tape is enveloped with elemental silver leaving none, or no significant portion thereof, exposed but one or both ends of the packed mixture in the tape may be exposed generally as a result of application of uniaxial pressure. Such exposure should not have a deleterious effect in the present process.

The silver covering of the tape is permeable to oxygen. It provides a substantially uniform reaction atmosphere and prevents possible loss, or significant loss, of the reactants by evaporation, particularly lead. Also, the silver covering prevents reaction of the packed mixture or sintered product with the firing container thereby enabling the use of cheap firing containers, such as alumina, at any reaction temperature. The silver covering does not react with the mixture of reactants or (2223) material, or does not react in an amount deleterious to the (2223). The silver covering is pressure transmitting.

The tape is fired in an oxidizing atmosphere at a reaction temperature ranging from 820° C. to 860° C. to react the reactants to convert (2122) to (2223). Specifically, conversion of the (2122) crystals to the (2223) crystals or phase results in growth of the (2223) crystals which causes dilation of the product contained in the tape. As a result, generally with significant conversion of (2122) crystals to (2223), a significantly swollen intermediate product is produced within the silver covering having an open porosity generally greater than 20% by volume and too large to produce the present sintered body in the final tape. The dilation and open porosity are determined empirically.

Specifically, in one embodiment where a single firing step is used to produce an intermediate tape containing dilated intermediate product, the (2122) crystals are converted to produce the (2223) phase generally in an amount ranging from 50% to less than 70% by weight of the product. In this single firing step to produce the intermediate tape, the particular amount of conversion should be sufficient to enable the production of a pressed intermediate tape containing a pressed product which undergoes no dilation, or no significant dilation, in the final firing to produce the tape containing the finally sintered reaction product.

The resulting intermediate tape is cooled, generally furnace cooled, in an oxidizing atmosphere, generally to room temperature, producing an intermediate tape containing a solid intermediate partially reacted sintered product. The c-axis orientation of the resulting (2223) crystals is substantially the same as, or does not differ significantly from, the c-axis orientation of the (2122) crystals. The intermediate tape has two major opposed surfaces which correspond to the two major opposed surfaces of the initial tape. The (2122) and (2223) crystals are substantially perpendicular to the major opposed surfaces of the intermediate tape.

A uniaxial pressure is applied normal to the major surfaces, i.e. faces, of the intermediate tape. Generally, such pressure is applied at room temperature and can be applied in a conventional manner, such as, for example, by means of a hydraulic press or by passing the tape through rollers. The uniaxial pressure is applied parallel, or substantially parallel, to the c-axis of the (2223) crystals. The uniaxial pressure should have no significant deleterious effect on the c-axis alignment of the (2223) crystals and remaining (2122) crystals. The particular pressure applied is determined empirically. It should at least remove the dilation in the intermediate product to produce a pressed intermediate tape containing a pressed product having a density which is at least the same as, and preferably higher than, the density of the packed mixture of reactants in the initial tape before firing.

In a preferred embodiment, the pressed intermediate tape is fired a plurality of times. Specifically, firing to produce an intermediate tape and application of uniaxial pressure to the resulting intermediate tape containing dilated intermediate product, is repeated a sufficient number of times to produce a final pressed intermediate tape containing pressed product which can be finally fired to produce the tape containing the finally sintered reaction product. In this embodiment, the extent of firing to produce an initial intermediate tape is determined empirically as well as the extent of firing of the resulting pressed intermediate tape, and the number of such firings of pressed intermediate tape. The uniaxial pressing of each intermediate tape should at least remove the dilation in the product contained in the tape to produce a pressed intermediate tape containing pressed product having a density which is the same as, and preferably higher than, the density of the product of the preceding pressed tape before firing and is determined empirically. Generally, in this embodiment, the firing of each successive pressed intermediate tape is carried out until an intermediate tape is produced which, when pressed, results in a final pressed intermediate tape containing pressed product that can be finally fired at reaction temperature without undergoing dilation, or significant dilation, thereby enabling production of the final tape containing the sintered body. In this preferred embodiment, generally the firing of the initial tape produces an initial intermediate tape which contains (2223) in an amount of at least 1% but less than 50% by weight of the intermediate product contained in the tape. In this embodiment, generally with each firing to produce an intermediate tape, the content of (2223) is increased by at least 1%, frequently by at least 5%, or by at least 10%, by weight of the product contained in the tape.

Generally, the final pressed intermediate tape contains intermediate sintered product which contains (2223) in an amount of less than 90%, or less than 80%, or less than 70%, by weight of the product.

In the present process, pressing of the intermediate tape containing intermediate sintered product pushes (2223) crystals back into contact with remaining reactants and improves their alignment so that, after one or more pressings, conversion of remaining (2122) to (2223) results in insignificant dilation with final firing.

The resulting silver covered final pressed intermediate product is fired in an oxidizing atmosphere at a reaction temperature ranging from 820° C to 860° C. to produce the finally sintered reaction product wherein the superconductive (2223) phase comprises at least 90% by weight of the product, and generally ranges from 90% to 95% by weight of the product.

The present reaction temperature for producing the intermediate tape, for each successive pressed intermediate tape, as well as for producing the tape containing the finally sintered reaction product, frequently ranges from 820° C. to 840° C. and preferably it is 835° C. The reaction temperature should be below the temperature at which a sufficient amount of liquid forms that segregates the reactants sufficiently to prevent production of (2223). The particular reaction temperature is determined empirically and depends largely on the composition of the reactants, i.e. the composition being fired.

Reaction time for producing the intermediate tape or tapes, as well as for producing the tape containing finally sintered reaction product, is determined empirically. It should be sufficient to enable the production of the present reaction product containing (2223) in an amount of at least 90% by weight of the product. Generally, total reaction time ranges from 100 to 200 hours.

The tape containing the finally sintered reaction product is cooled in an oxidizing atmosphere, generally furnace cooled, generally to about room temperature, to produce the present tape, i.e. the final tape, containing the superconductive (2223) sintered body. Frequently, the sintered body in the final tape has an open porosity ranging from 5% to 20% by volume of the body. Generally, it has no closed porosity, or no significant amount of closed porosity.

By open porosity, it is meant herein pores or voids which are open to the surface of the sintered body, thereby making the interior surfaces accessible to the oxygen in the ambient atmosphere. By closed porosity, it is meant herein closed pores or voids in the sintered body, i.e. pores not open to the surface of the body and therefore not in contact with the oxygen in the ambient atmosphere. Porosity can be determined by standard metallographic techniques, such as, for example, optically examining a polished cross section of the body.

The cooling rate of the fired tapes can vary provided it has no significant deleterious effect. Specifically, cooling should not be so fast as to cause thermal shock. In one embodiment, the fired tapes are furnace cooled.

Generally, the oxidizing atmosphere used throughout the present process, i.e. the firing atmosphere and cooling atmosphere, is comprised of at least 1% by volume, or at least 20% by volume, of oxygen and the remainder of the atmosphere is a gas which has no significant deleterious effect on the products such as nitrogen or a noble gas such as argon or helium. Preferably, the oxidizing atmosphere is air. Generally, the oxidizing atmosphere is at about atmospheric pressure.

In one embodiment, the sintered body in the final tape is totally enveloped or encapsulated with elemental silver leaving none, or no significant portion thereof, exposed. In another embodiment, the longitudinal surface of the sintered body in the final tape is enveloped with elemental silver leaving none, or no significant portion thereof, exposed but one or both ends of the sintered body in the tape may be exposed to the ambient, generally as a result of a particular application of uniaxial pressure. Such exposure should not have a deleterious effect on the use of the final tape.

Generally, at least 30%, frequently at least 50%, or at least 70%, by weight of the final tape is comprised of elemental silver with the balance being comprised of the superconductive sintered body. The sintered body is a continuous elongated body generally passing through the entire length, or through substantially the entire length, of the final tape. Preferably, the sintered body passes substantially centrally through the final tape. Generally, the sintered body is in the form of a tape having a thickness ranging from 0.001 to 0.040 inches.

Generally, the final tape contains a superconductive sintered body which has a zero resistance transition temperature of greater than about 100K, preferably greater than about 105K, and frequently it ranges from about 105K to about 111K.

The present tape containing the present sintered body is useful as a superconducting device such as, for example, a magnetic shield at low temperatures as well as a conductor for magnets, motors, generators, and power transmission lines.

The invention is further illustrated by the following examples wherein the procedure was as follows unless otherwise stated:

The dispersant used was an organic dispersant sold under the trademark Triton X-100.

All firing or heating as well as cooling was carried out in air at about atmospheric pressure.

Firing was carried out in a silicon carbide resistance furnace.

By room temperature herein it is meant a temperature ranging from 15° C. to 30° C.

EXAMPLE 1

In this example, (2122) powder was produced according to U.S. Ser. No. 07/399,197.

A particulate mixture comprised of 100.09 grams of calcium carbonate, 295.26 grams of strontium carbonate and 159.08 grams of cupric oxide was wet milled in a two liter polyethylene jar with 3200 grams of ⅜ inch diameter dense zirconia media using distilled water as the milling fluid and a few drops of dispersant for three hours at room temperature.

The resulting slurry was separated from the zirconia media and dried in air in an oven at from about 120° C. to 150° C.

The resulting powdered material had an average particle size which was submicron. It was placed in shallow, high density, high purity alumina ceramic boats to form a low bulk density powder bed roughly 1.0 to 1.5 cm in depth in each boat. Loose fitting alumina lids were placed on the boats.

The material was heated in air at about atmospheric pressure to 750° C. at a rate of 100° C. per hour to protect the alumina boats from thermal shock, then to 925° C. at a rate of 10° C. per hour. It was maintained at 925° C. for 48 hours and then furnace cooled to room temperature. X-ray diffraction analysis of the resultant product showed that the carbonates had completely decomposed to their respective oxides and that these oxides had reacted with themselves and the cupric oxide to form compounds and had also combined to form solid solutions. No appreciable amounts of the individual oxides was detected.

Two aliquots of the composition comprised of 95.10 grams of the resulting Ca—Sr—Cu-oxide product, 103.85 grams of bismuth sesquioxide and 50 grams of alkali chloride salt were dry-milled in a 500 ml polyethylene jar with 1600 grams of $\frac{3}{8}$ inch diameter dense zirconia media for 45 minutes at room temperature. The salt was comprised of NaCl-50 mol % KCl and comprised about 20% by weight of the total amount of oxides and chloride present. The milled material was separated from the media on a Nylon screen and placed in a high density, high purity alumina boat to form a low bulk density powder bed. A loose fitting alumina lid was placed on the boat.

The material was reacted by heating it to 850° C. at a rate of 100° C. per hour, maintained at 850° C. for 44 hours, then furnace cooled to room temperature, all in air at about atmospheric pressure.

The superconductive product was in the form of crystalline aggregates intermixed with the solidified alkali chloride solvent. It was retrieved by dissolving the alkali chlorides in distilled water, assuming a salt solubility of 20 g/100 ml; a period of 30 minutes was allowed for this process. The particulate superconductor, now free of the alkali chlorides, was collected on a filter, washed at room temperature with ten 300 ml aliquots of distilled water, and, finally, two 300 ml aliquots of absolute methanol. The superconductive material was finally air dried on the filter at room temperature at atmospheric pressure.

The superconductivity of the aggregate powder was determined by a conventional technique, i.e. the AC Susceptibility Technique. This technique comprised using the powder as an active element in a L-C resonance circuit and measuring the resonance frequency as a function of the circuit's temperature. The transition temperature is that at which there is a larger than background increase in the resonant frequency.

The powder was determined to have a zero resistance transition temperature of about 73K.

X-ray diffraction analysis of the superconductive aggregate powder showed it to be phase pure $Bi_2CaSr_2Cu_2O_x$. From other work, it was known that x was about 8.

EXAMPLE 2

In this example, an oxide product comprised of mole equivalents of $Ca_2CuO_3$ and CuO was produced. 100.09 grams of calcium carbonate (average particle size of about 1 microns) and 79.54 grams of cupric oxide (average particle size of about 50 microns) were milled with zirconia balls in distilled water containing a few drops of dispersant at room temperature for 2 hours. The resulting slurry was dried in air at 100° C. and the zirconia balls were then separated on a screen.

The resulting dried mixture was fired in air at 925° C. for 48 hours and furnace cooled to room temperature. The resulting product was friable and ground with mortar and pestle to a flowable powder of about 40 mesh (U.S. Screen Size).

X-ray diffraction analysis of this powder showed it was comprised of a mixture of $Ca_2CuO_3$ and CuO ("CaCuO$_2$"). The mixture appeared uniform.

EXAMPLE 3

In this example, (2223) powder was produced as set forth in Example 3 of U.S. Ser. No. 07/478,393.

50.00 grams of the aggregate (2122) powder produced in Example 1, 9.54 grams of the oxide product powder produced in Example 2 (1.5 mole per mole of (2122)) and 3.77 grams of PbO powder with an average particle size of 2.0 microns (0.3 mole per mole of (2122)) were dry milled at room temperature with zirconia balls for about 0.5 hours. The resulting mixture was recovered from the zirconia balls by screening, The resulting dry particulate mixture appeared to be comprised of an intimate uniform mixture of the reactants.

About a 3 mm thick substantially uniform layer of the dry mixture was placed in a gold foil boat, fired in air at 840° C. for 103 hours, and quenched in air to room temperature. The resulting product was a very friable product. It was easily comminuted with a mortar and pestle.

The resulting dry powder was a mostly platey powder which ranged in size from submicron to 100 microns or more in its longest dimension.

X-ray diffraction analysis of the powder showed that it contained the phase $Bi_{1.7}Pb_{.3}Ca_2Sr_2Cu_3O_{10+z}$ in an amount of about 95% by weight of the powder. From other work, it was known that z in this phase was very nearly equal to zero.

The superconductivity of the resulting powder was determined by the same conventional technique disclosed in Example 1.

The powder was determined to have a zero resistance transition temperature of about 107.5K.

EXAMPLE 4

This is a paper example.

50.00 grams of the aggregate (2122) powder as is produced in Example 1, 9.54 grams of the oxide product powder as is produced in Example 2 (1.5 mole per mole of (2122)) and 3.77 grams of PbO powder with an average particle size of 2.0 microns (0.3 mole per mole of (2122)) is dry milled at room temperature with zirconia balls for about 0.5 hours. The resulting mixture is recovered from the zirconia balls by screening.

The resulting dry particulate mixture comprises an intimate uniform mixture of the reactants.

A hollow tube of elemental silver open at both ends is closed at one end with a plug of silver. The tube has a length of 8 inches, a thickness of 0.5 inches, and an inner diameter of 0.25 inches.

The tube is packed with the particulate mixture of reactants to substantially fill the tube with a packed mixture having a density of 50% of its theoretical density. The open end of the tube is plugged with silver leaving no free space between the plug and the packed mixture thereby maintaining the density of the packed mixture.

The resulting closed packed tube is swaged in its radial direction using a conventional swager. Swaging is carried out at room temperature sufficiently to increase the density of the packed mixture to 70% of its theoretical density. The outside surface of the swaged tube is comprised of silver.

The resulting swaged tube is passed through a wire-drawer at room temperature to produce a wire having an outside diameter of 0.060 inches and a length greater than 24 inches. The outside surface of the wire is comprised of silver.

The wire is pressed in a hydraulic press at room temperature. Specifically, a uniaxial pressure of 7,000 psi is applied to the wire in its radial direction to orient the (2122) crystals with their c-axis substantially parallel to each other resulting in a tape, i.e. an initial tape, having two major opposed surfaces to which the c-axis of (2122) are substantially perpendicular. The tape has a thickness of 0.030 inches and a width of about 0.090 inches.

The initial tape is placed in an open alumina pan and heated to 835° C. at 50° C./hour, held at 835° C. for 24 hours, then furnace cooled to room temperature, all in an air atmosphere at atmospheric pressure. The resulting intermediate tape contains significantly dilated intermediate sintered product with an open porosity greater than 30% which contains (2223) in an amount of about 25% by weight of the product.

The intermediate tape is pressed in a hydraulic press at room temperature. Specifically, a uniaxial pressure of about 7,000 psi is applied to one of its major surfaces to remove the dilation.

The firing and pressing steps are then repeated four times, i.e. the resulting pressed intermediate tape is fired and each resulting intermediate tape is pressed four more times to produce a final pressed intermediate tape. Each pressing step removes the dilation and sufficient open porosity to produce a pressed intermediate tape containing intermediate product with a density higher than that of the product contained in the preceding tape before it is fired.

It is determined that the final pressed intermediate tape contains pressed product which does not undergo significant dilation again at reaction temperature and that (2223) in the product is less than 80% by weight of the product.

The final pressed intermediate tape is heated to 835° C. at 50° C./hour, held at 835° C. for 100 hours, then furnace cooled to room temperature, all in an air atmosphere at atmospheric pressure.

The resulting final tape has a thickness of 0.025 inches. Its entire longitudinal surface is comprised of elemental silver. It contains a finally sintered body containing superconductive (2223) phase in an amount of at least 90% by weight of the body. Also, the finally sintered body has an open porosity greater than 10% but less than 20% by volume of the body.

The superconductivity of the resulting finally sintered body in the tape can be determined by a conventional technique, i.e. four probe resistivity measurement.

The finally sintered body in the tape could have a zero resistance transition temperature of about 107.5K.

What is claimed is:

1. A process for producing a final tape comprised of a continuous elongated solid sintered body with its longitudinal surface enveloped with elemental silver leaving no significant portion of said longitudinal surface exposed, said sintered body containing oriented superconductive crystalline $Bi_{2-y}Pb_yCa_2Sr_2Cu_3O_{10\pm z}$ phase where y ranges from 0.1 to 0.5 and z ranges from zero to less than 1 in an amount of at least 90% by weight of said body, which comprises the following steps:

(a) forming a particulate mixture of reactants comprised of $Bi_2CaSr_2Cu_2O_{8-x}$ where x ranges from 0 to 0.5, $Ca_2CuO_3$, cupric oxide, and lead oxide, said mixture of reactants being formulated to produce said superconductive phase and to provide an excess amount of said $Ca_2CuO_3$ and cupric oxide sufficient to drive the reaction to produce said superconductive phase in said sintered body, said $Ca_2CuO_3$ and cupric oxide in said mixture being present in substantially mole equivalents to each other, said $Bi_2CaSr_2Cu_2O_{8\pm x}$ being comprised of substantially monodispersed crystals, said particulate mixture being a sinterable mixture;

(b) providing a hollow tube open at one end comprised of elemental silver, said tube having dimensions sufficient to produce said tape;

(c) packing said particulate mixture into said silver tube to produce a packed particulate mixture therein having a density ranging from 40% to 60% of its theoretical density;

(d) closing the open end of the resulting packed tube with elemental silver producing a closed tube comprised of said packed mixture and silver;

(e) applying physical force to the resulting packed tube in the radial direction to increase the density of said packed mixture to at least 65% of its theoretical density producing a deformed tube, (f) drawing said deformed tube to produce a wire, said wire having dimensions sufficient to produce said tape;

(g) applying uniaxial pressure to said wire in the radial direction to orient said $Bi_2CaSr_2Cu_2O_{8\pm x}$ crystals with their c-axis substantially parallel to each other producing an initial tape with two major opposed surfaces to which said c-axis of said $Bi_2CaSr_2Cu_2O_{8\pm x}$ crystals are substantially perpendicular;

(h) firing said initial tape in an oxidizing atmosphere at a reaction temperature ranging from 820° C. to 860° C. converting a sufficient amount of said $Bi_2CaSr_2Cu_2O_{8\pm x}$ crystals to said superconductive crystalline $Bi_{2-y}Pb_yCa_2Sr_2Cu_3O_{10\pm z}$ phase to produce a first intermediate tape containing a significantly dilated intermediate partly reacted sintered product wherein said $Bi_{2-y}Pb_yCa_2Sr_2Cu_3O_{1\pm z}$ phase comprises less than 50% by weight of said intermediate product;

(i) cooling the first intermediate tape in an oxidizing atmosphere producing a first intermediate tape containing intermediate solid sintered product;

(j) applying uniaxial pressure to a major surface of the resulting first intermediate tape to at least remove the dilation produced in step (h);

(k) firing the resulting first pressed intermediate tape in an oxidizing atmosphere at a reaction temperature ranging from 820° C. to 860° C. converting a sufficient amount of said $Bi_2CaSr_2Cu_2O_{8\pm x}$ crystals to said superconductive crystalline $Bi_{2-y}Pb_yCa_2Sr_2Cu_3O_{10\pm z}$ phase to produce a second intermediate tape containing a significantly dilated intermediate partly reacted sintered product wherein said $Bi_{2-y}Pb_yCa_2Sr_2Cu_3O_{10\pm z}$ phase comprises less than 90% by weight of said intermediate product;

(l) cooling the second intermediate tape in an oxidizing atmosphere producing a second intermediate tape containing intermediate solid sintered product;

(m) applying uniaxial pressure to a major surface of the resulting second intermediate tape to at least remove the dilation produced in step (k);

(n) firing the resulting pressed intermediate tape containing pressed intermediate product in an oxidizing atmosphere at a reaction temperature ranging from 820° C. to 860° C. to produce a tape containing finally sintered reaction product wherein said superconductive phase comprises at least 90% by weight of said reaction product, said reaction temperature being below the temperature at which sufficient liquid forms to prevent production of said sintered products, said pressed intermediate product undergoing no significant dilation in said final firing; and (o) cooling the resulting tape in an oxidizing atmosphere producing said final tape wherein said solid sintered body has an open porosity ranging from 5% to 20% by volume of the body, said steps (h) to (m) being carried out sufficiently to produce said tape containing said finally sintered reaction product in step (n).

2. A process for making a superconductor tape having a core of sintered polycrystalline $Bi_{2-y}Pb_yCa_2Sr_2Cu_3O_{10\pm x}$ in a silver covering which comprises forming a tape having a silver covering and a core comprising a reaction admixture comprising calcium copper oxide, cupric oxide, lead oxide, and $Bi_2CaSr_2Cu_2O_{8\pm x}$ superconductor powder having the c-axis of the crystals substantially all oriented perpendicular to the major surfaces of the tape; firing the tape in an oxidizing atmosphere at a reaction temperature between about 820° and 860° C. to convert $Bi_2CaSr_2Cu_2O_{8\pm x}$ to $Bi_{2-y}Pb_yCa_2Sr_2Cu_3O_{10\pm x}$ whereby dilation of the tape occurs; cooling the tape; compressing the tape with uniaxial pressure thereby removing the dilation; and sintering the core of the tape by firing the tape in an oxidizing atmosphere at a temperature between about 820° C. and 860° C.

3. A process for making a superconductor tape comprising a sintered core of polycrystalline $Bi_{2-y}Pb_yCa_2Sr_2Cu_3O_{10\pm x}$ and an outer cover of silver metal which comprises the steps of packing a silver tube with a reaction mixture comprising calcium copper oxide, cupric oxide, lead oxide, and $Bi_2CaSr_2Cu_2O_{8\pm x}$ superconductor powder; forming the packed tube into a wire; applying uniaxial pressure to the wire to form the wire into a tape and orient the crystals of $Bi_2CaSr_2Cu_2O_{8\pm x}$ with the c-axis substantially perpendicular to the surface of the tape; reaction firing the tape in an oxidizing atmosphere at a reaction temperature between about 820° and 860° C. to convert $Bi_2CaSr_2Cu_2O_{8\pm x}$ to $Bi_{2-y}Pb_yCa_2Sr_2Cu_3O_{10\pm x}$ whereby dilation of the tape occurs; cooling the uniaxially pressing the dilated tape thereby removing the dilation and densifying the $Bi_{2-y}Pb_yCa_2Sr_2Cu_3O_{10\pm x}$ superconductor; and sintering the superconductor-containing tape in an oxidizing atmosphere at a temperature between about 820° C. and 860° C.

4. The process of claim 3 wherein the reaction firing, cooling and pressing steps are repeated to achieve complete conversion of $Bi_2CaSr_2Cu_2O_{8\pm x}$ to $Bi_{2-y}Pb_yCa_2Sr_2Cu_3O_{10\pm x}$.

5. The process of claim 3 in which the oxidizing atmosphere is air and reaction firing is carried out at a temperature from about 820° C. to 840° C.

6. The process of claim 3 wherein y is from about 0.25 to about 0.35.

* * * * *